United States Patent
Chen et al.

(10) Patent No.: US 7,176,138 B2
(45) Date of Patent: Feb. 13, 2007

(54) SELECTIVE NITRIDE LINER FORMATION FOR SHALLOW TRENCH ISOLATION

(75) Inventors: Chien-Hao Chen, Ilan (TW); Vincent S. Chang, Hsinchu (TW); Ji-Yi Yang, Taoyuan (TW); Chia-Lin Chen, Hsinchu (TW); Tze-Liang Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/970,090

(22) Filed: Oct. 21, 2004

(65) Prior Publication Data

US 2006/0099771 A1    May 11, 2006

(51) Int. Cl.
*H01L 21/311*  (2006.01)
(52) U.S. Cl. .................. 438/700; 438/257; 438/745; 257/E21; 257/211; 257/223; 257/309
(58) Field of Classification Search ................ 438/700, 438/270, 663, 692, 706, 744, 723, 724, 756, 438/757, 954
See application file for complete search history.

(56) References Cited

U.S. PATENT DOCUMENTS

| | | | | |
|---|---|---|---|---|
| 5,989,975 A | * | 11/1999 | Kuo | 438/424 |
| 6,001,706 A | * | 12/1999 | Tran et al. | 438/424 |
| 6,140,242 A | * | 10/2000 | Oh et al. | 438/698 |
| 6,261,921 B1 | * | 7/2001 | Yen et al. | 438/424 |
| 6,689,665 B1 | * | 2/2004 | Jang et al. | 438/296 |
| 6,746,933 B1 | * | 6/2004 | Beintner et al. | 438/424 |

* cited by examiner

*Primary Examiner*—David Nhu
(74) *Attorney, Agent, or Firm*—Tung & Associates

(57) ABSTRACT

A method for forming a divot free nitride lined shallow trench isolation (STI) feature including providing a substrate including an STI trench extending through an uppermost hardmask layer into a thickness of the substrate exposing the substrate portions; selectively forming a first insulating layer lining the STI trench over said exposed substrate portions only; backfilling the STI trench with a second insulating layer; planarizing the second insulating layer; and, carrying out a wet etching process to remove the uppermost hardmask layer.

21 Claims, 3 Drawing Sheets

SELECTIVE NITRIDE LINER FORMATION FOR SHALLOW TRENCH ISOLATION

FIELD OF THE INVENTION

This invention generally relates to integrated circuit micro-fabrication processes and more particularly to a method for selectively forming a nitride liner in a shallow trench isolation (STI) structure to avoid wet etching divot formation in the nitride liner thereby improving device performance and reliability.

BACKGROUND OF THE INVENTION

In the integrated circuit industry today, hundreds of thousands of semiconductor devices are built on a single chip. Every device on the chip must be electrically isolated to ensure that it operates independently without interfering with another. The art of isolating semiconductor devices has become an important aspect of modern metal-oxide-semiconductor (MOS) and bipolar integrated circuit technology for the electrical isolation of device active regions. With the high integration of semiconductor devices, improper electrical isolation among devices increasingly leads to current leakage, for example junction leakage, consuming a significant amount of power as well as compromising device functionality. Among some examples of reduced functionality caused by improper electric isolation include latch-up, which can damage the circuit temporarily, or permanently, noise margin degradation, voltage threshold shift and cross-talk.

Shallow trench isolation (STI) is a preferred electrical isolation technique particularly for a semiconductor chip with high integration. The formation of STI structures generally involves filling trenches etched into a semiconducting substrate, for example silicon, with a chemical vapor deposition (CVD) silicon oxide ($SiO_2$) which is then planarized by a chemical mechanical polishing (CMP) process which stops on a layer of silicon nitride (e.g., $Si_3N_4$) to yield a planar surface.

Shallow trench isolation features with trenches having submicrometer dimensions are effective in preventing latch-up and punch-through phenomena. Broadly speaking, conventional methods of producing a shallow trench isolation feature include: forming a hard mask of silicon nitride, also referred to as a pad nitride, overlying a pad oxide which in turn overlies the silicon substrate. The pad nitride is then patterned by a photolithographic process and etched to form a hard mask defining a trench feature. A trench is then etched into the silicon substrate to form a shallow trench isolation structure. Subsequently, the shallow trench isolation feature is back-filled, with a dielectric material, for example a CVD silicon dioxide, also referred to as STI oxide, followed by CMP planarization to remove excess STI oxide above the silicon nitride (hardmask) level. Subsequently, the silicon nitride hardmask layer is removed according to a wet etching process using hot phosphoric acid ($H_3PO_4$).

Residual stresses in STI structures caused by backfilling with STI oxide has become a problem as device sizes have decreased, frequently contributing to reduced charge carrier mobility in adjacent active regions. Prior art methods have proposed depositing nitride layers by CVD processes to counteract the stresses formed by the STI oxide and to act as an oxygen diffusion barrier.

One problem with prior art STI formation processes including CVD nitride liners deposited to line the STI trench is that the pad nitride and pad oxide layers must be removed by a wet etching process following STI oxide backfill and planarization steps. Typically wet etching processes include using phosphoric acid ($H_3PO_4$) to remove the pad nitride layer and hydrofluoric acid, hereinafter referred to as HF, to remove the underlying pad oxide layer.

A problem with etching both the pad nitride layer and the pad oxide layer is that the $H_3PO_4$ attacks the CVD nitride liner in the pad nitride etching process forming a divot at the STI trench edges and HF etching solution further attacks the STI oxide and an oxide liner, if present, along the STI trench edges thereby further widening the divot formed in the pad nitride etching process. As a result, etching divots are formed at the trench edges (corners) where high electrical fields are present during device operation causing device degradation including junction leakage and reverse short channel effects. Another drawback in the formation of divots at the STI trench edges is that the divot will act as a collector of residual polysilicon and/or metals in subsequent processes thereby increasing the likelihood of electrical shorting.

There is therefore a need in the semiconductor processing art to develop an improved STI formation process to avoid the formation of etching divots at STI trench edges to improve device performance and reliability.

It is therefore an object of the invention to provide an improved STI formation process to avoid the formation of etching divots at STI trench edges to improve device performance and reliability in addition to overcoming other shortcomings in the prior art.

SUMMARY OF THE INVENTION

To achieve the foregoing and other objects, and in accordance with the purposes of the present invention, as embodied and broadly described herein, the present invention provides a shallow trench isolation (STI) structure substantially free of etching divots and a method for forming the same.

In a first embodiment, the method includes providing a substrate including an STI trench extending through an uppermost hardmask layer into a thickness of the substrate exposing the substrate portions; selectively forming a first insulating layer lining the STI trench over said exposed substrate portions only; backfilling the STI trench with a second insulating layer; planarizing the second insulating layer; and, carrying out a wet etching process to remove the uppermost hardmask layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Referring to FIGS. 1A–1H, in an exemplary implementation of the present invention, cross sectional views of a portion of a semiconductor wafer show an integrated circuit manufacturing process in stages of shallow trench isolation (STI) feature manufacture. The method is particularly advantageous for forming 0.13 micron technology characteristic dimension devices and smaller.

Figure 1A:
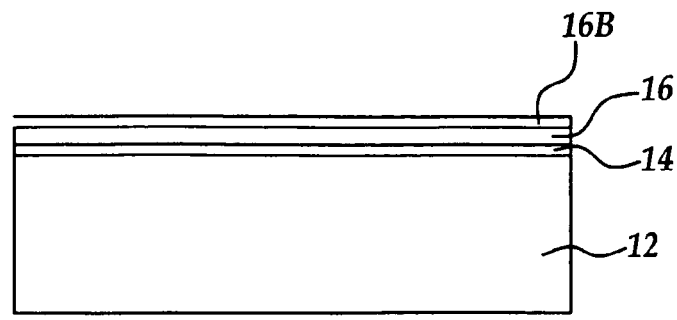
FIGS. 1A–1H are conceptual cross sectional views of a portion of a shallow trench isolation (STI) region showing stages of manufacture of an STI structure according to embodiments of the present invention.

Referring to FIG. 1A is shown a silicon substrate 12, for example a single crystalline p-doped silicon substrate or a p− epi-on p+ substrate as is known in the art. Overlying the silicon substrate 12 is a thermally grown $SiO_2$ layer 14, also referred to as a pad oxide layer formed over the silicon substrate 12 surface. The pad oxide layer 14 is preferably grown by a conventional thermal oxidation process, to a thickness of about 25 Angstroms to about 150 Angstroms. For example, the pad oxide layer 14 is grown in rapid thermal oxidation process (RTO) or in a conventional furnace annealing process including oxygen at a temperature of about 800° C. to about 1150° C.

Formed over the pad oxide layer 14 is a hardmask nitride layer 16, also referred to as a pad nitride layer, preferably silicon nitride (e.g., $Si_3N_4$) deposited by a CVD, for example an LPCVD process. It will be appreciated that silicon oxynitride (e.g., SiON) may be used or included in the hardmask layer 16. The hardmask layer 16, for example may include an uppermost layer to improve critical dimension control during a subsequent trench etching process, for example formed of LPCVD SiON or $SiO_2$. For example, the hardmask layer 16 is formed to have a thickness of between about 500 Angstroms and 3000 Angstroms. In addition, an organic or inorganic anti-reflective coating (ARC) e.g., SiON 16B is preferably formed over the hardmask layer 16 to reduce light reflections in a subsequent photolithographic process.

Figure 1B:
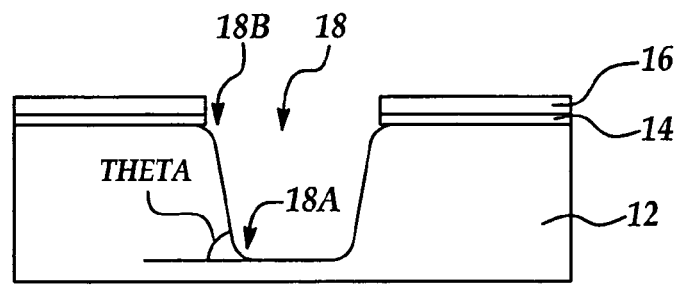

Referring to FIG. 1B, following formation of the hardmask layer 16, the hardmask layer is first photolithographically patterned and etched to form an etching mask for etching an STI trench e.g., 18 in the silicon substrate 12. An STI trench feature 18 is then dry etched by a conventional silicon etching chemistry into the silicon substrate to a depth between about 600 Angstroms and about 5000 Angstroms, preferably forming sloped sidewall portions having an angle, theta (θ), with respect to the process surface of the substrate between about 85 and 89 degrees, the uppermost portion of the trench being wider than the bottom portion. A conventional etching chemistry, including for example, $Cl_2$, HBR, and $O_2$ may be used to dry etch the trench 18. Preferably, during or following the trench etching process, trench bottom and top corners, e.g., 18A and 18B are preferably formed having rounded corners e.g., having a radius of curvature to minimize stress and improve device performance. The ARC layer 16B may be removed in the dry etching process.

Figure 1C:
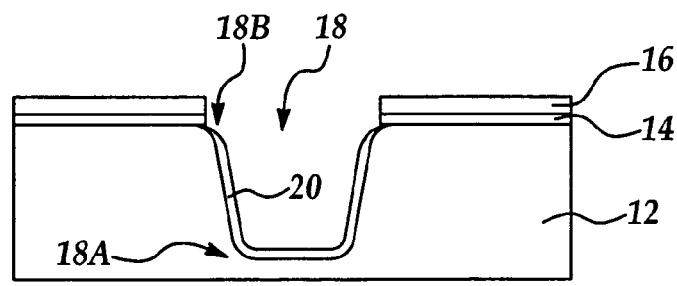
Figure 1D:
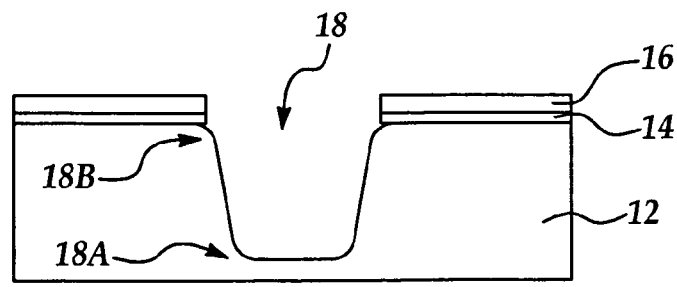

Referring to FIG. 1C, alternatively the bottom and top corners 18A and 18B may be rounded or further rounded following the dry etching process, e.g., increase a respective positive and negative radius of curvature, by first thermally growing a liner of silicon oxide e.g., 20 by conventional methods e.g., RTO or furnace heating, over the exposed silicon substrate portions of STI trench 18, followed by removal according to wet or dry etching, preferably a wet etching method, e.g., dipping in a hydrofluoric acid (hereinafter HF) containing aqueous solution, to form rounded bottom and top corners e.g., 18A and 18B as shown in FIG. 1D.

Figure 1E:
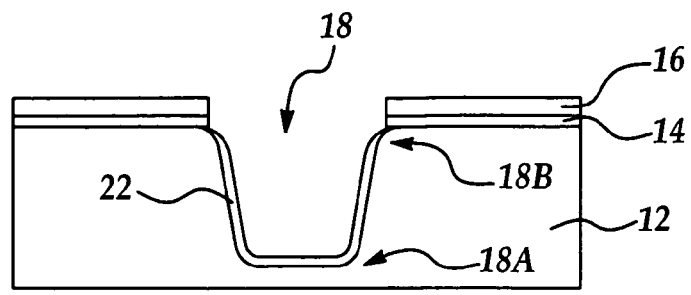

Referring to FIG. 1E, according to a critical aspect of the invention, following removal of the optionally formed silicon oxide liner 20, the STI trench 18 with exposed silicon portions is subjected to a plasma and/or thermal nitridation process to form a thin liner of silicon nitride 22 selectively lining the STI trench 18, e.g., preferably greater than about 5 Angstroms, for example from about 10 Angstroms to about 50 Angstroms.

In an exemplary thermal nitridation method, the STI trench 18 is subjected to an annealing treatment (annealing nitridation) in the presence of $NH_3$, optionally including $N_2$. The annealing treatment is preferably carried out at about 700° C. to about 900° C., for example including from about 1 Vol % to about 50 Vol % of $NH_3$ with the remaining portion made up of $N_2$, for a period of from about 5 minutes to about 30 minutes. Following the annealing treatment, the process wafer may additionally be cooled in the presence of the $N_2$ and/or $NH_3$ containing ambient. In one embodiment, preferably a mixture of $N_2/NH_3$ is used in the annealing treatment having a ratio of $NH_3$ to $N_2$ of from about 1 to 1 to about 3 to 1.

In an exemplary plasma nitridation, the STI trench 18 is subjected to a plasma assisted nitridation treatment including plasma source gases including $NH_3$, $N_2$, NO, $N_2O$, or combinations thereof. In an exemplary process, the gases may be supplied separately or mixtures may be formed. For example, a mixture of $NH_3$ and $N_2$ may be used having about a volumetric ratio of $NH_3$ to $N_2$ of about 1 to 1 to about 3 to 1. In addition, an inert gas such as He and Ar may be included in the mixture to assist in the formation of the plasma. The plasma is preferably formed as a high density plasma. For example, the plasma may be generated by conventional plasma sources such as helicon; helical-resonator; electron-cyclotron resonance; or inductively coupled. For example, using an ICP (inductively coupled plasma) source, an RF power of about 100 Watts to about 1000 Watts is suitably used. An RF or DC bias may be optionally applied to the process wafer surface to increase a rate of nitride layer growth. Preferably, the plasma assisted nitridation treatment is carried out at pressures on of about 1 mTorr to about 10 Torr, more preferably from about 100 mTorr to about 5 Torr and temperatures of about 0° C. to about 400° C., for a period of about 30 seconds to about 300 seconds. Following formation of the silicon nitride liner 22, preferably a post annealing treatment is carried out at 700° C. to about 900° C. for about 1 minute to about 10 minutes. Optionally, the post annealing treatment may include a $NH_3$ and/or $N_2$ ambient according to the same embodiments for the thermal nitridation treatment to further increase the thickness of the silicon nitride liner 22.

Figure 1F:
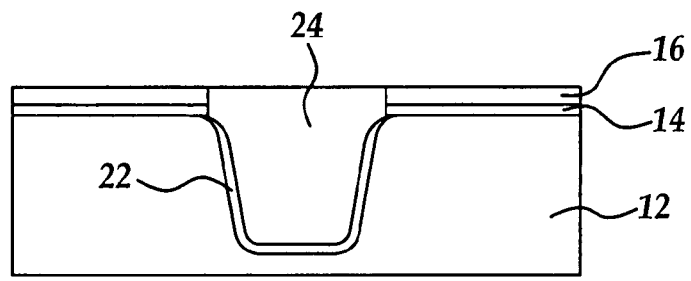

Referring to FIG. 1F, following formation of the silicon nitride liner 22, a CVD process including, for example, a PECVD or an HDP-CVD process is carried out to blanket deposit $SiO_2$ layer 24, e.g., TEOS $SiO_2$, also referred to as an STI oxide, to backfill (fill) the STI trench 18 including covering the silicon nitride layer 16. For example, the STI oxide is deposited to a thickness of between about 3000 and about 9000 Angstroms. Following deposition of the STI oxide layer 24, a conventional annealing process, for example a conventional rapid thermal annealing (RTA) process is optionally carried out, for example at temperatures from about 800–1150° C. to increase the density of the oxide and improve its quality. A conventional chemical mechanical polish (CMP) planarization process is then carried out to planarize the STI oxide layer 24 stopping on the pad nitride (hardmask) layer 16.

Figure 1G:
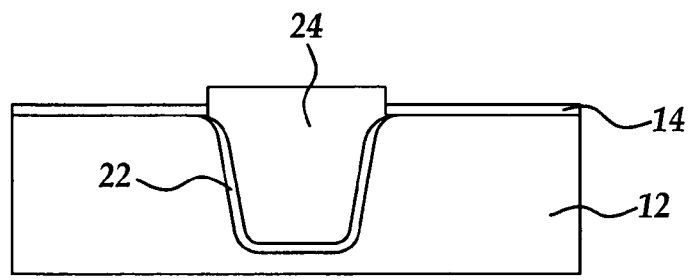
Figure 1H:
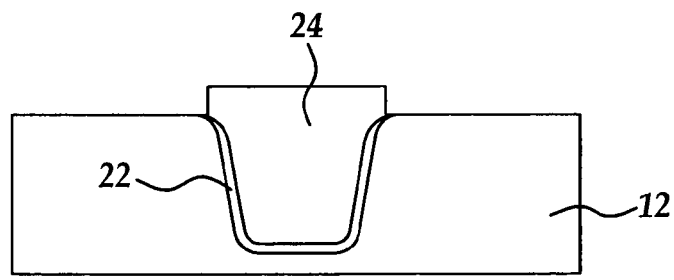

Referring to FIG. 1G, Following the STI oxide CMP process the hardmask layer 16 is first removed by a conventional wet etching process using a heated $H_3PO_4$ aqueous solution. For example, the hardmask layer wet etching process includes contacting the hardmask layer with the heated H$_3$PO$_4$ aqueous solution, for example, a dipping process where the process wafer is dipped into one or more wet etching baths of heated phosphoric acid (H3PO4) wet etching solution heated from about 150° C. to about 175° C., more preferably about 165° C. The pad oxide layer 14 is then removed using a conventional aqueous HF solution to expose the silicon substrate 12 surface as shown in FIG. 1H, without forming etching divots at the STI trench edges in contrast with prior art processes.

Advantageously, according to the present invention, the selectively formed silicon nitride liner 22 is not attacked by the pad nitride (hardmask layer) 16 wet etching process, thereby avoiding divot formation at the STI trench edges (corners). In addition, divot formation during the pad oxide 14 etching process is avoided since the pad oxide layer 14 partially covers and protects the silicon nitride liner 22 which grows into the STI trench surface during the nitridation process to form the silicon nitride liner 22 according to preferred embodiments. Advantageously the silicon nitride liner 22 formed according to preferred embodiments is formed in tensile stress on the exposed silicon substrate surface (STI trench surface) thereby offsetting the compressive stress formed in the STI oxide 24 during the oxide backfilling process. As a result, device performance is improved including increased charge mobility in adjacent active areas where completed MOSFET devices are subsequently formed. Moreover, the absence of divots at the STI trench edges avoids the formation of a collection area for residual polysilicon or metal residues in subsequent processes, reducing the incidence of device shorting and current leakage. In addition, reverse short channel effects, exacerbated by divot formation and current leakage are avoided thereby improving both device performance and reliability.

Figure 2:
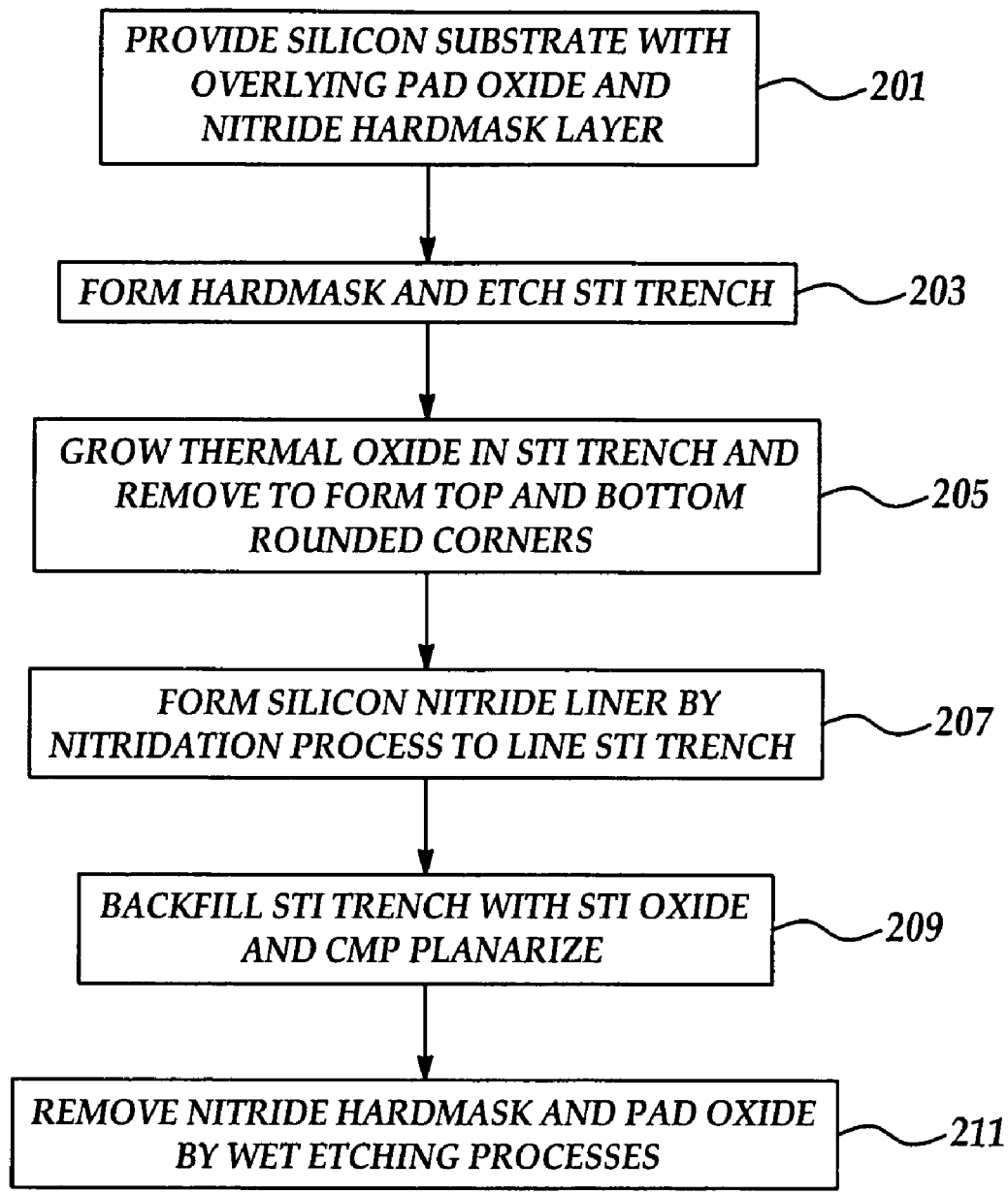
FIG. 2 is a process flow diagram including several embodiments of the present invention.

Referring to FIG. 2 is a process flow diagram including several embodiments of the present invention. In process 201, a silicon substrate with an overlying pad oxide and nitride hardmask layer is provided. In process 203, an etching mask is formed in the hardmask layer and an STI trench etched. In process 205 an oxide layer is thermally grown within the trench and removed to form rounded top and bottom trench corners according to preferred embodiments. In process 207, a silicon nitride liner is formed by a nitridation process to selectively line the STI trench. In process 209, the STI trench is backfilled with an oxide and planarized according to a CMP process. In process 211, wet etching processes are carried out to first remove the nitride hardmask layer and the underlying pad oxide layer avoiding divot formation at the STI trench edges.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a shallow trench isolation (STI) feature comprising the steps of:
   providing a substrate comprising an STI trench extending through an uppermost nitride hardmask layer into a thickness of the silicon substrate exposing said silicon substrate portions, said STI trench comprising upper and bottom rounded corners comprising said silicon substrate;
   selectively forming a first insulating layer lining the STI trench over said exposed silicon substrate portions only;
   backfilling the STI trench with a second insulating layer;
   planarizing the second insulating layer; and,
   carrying out a wet etching process to remove the uppermost nitride hardmask layer.

2. The method of claim 1, wherein the rounded bottom and upper corners are formed by a plasma assisted etching process.

3. The method of claim 1, wherein the rounded bottom and upper corners are formed according to the steps of:
   thermally growing an oxide layer to line the STI trench; and,
   removing the oxide layer according to a wet etching process.

4. The method of claim 1, wherein said first insulating layer comprises a silicon nitride layer.

5. The method of claim 4, wherein said silicon nitride layer is selectively formed by a thermal nitridation process comprising heating in an NH$_3$ containing ambient at a temperature of from about 600° C. to about 900° C.

6. The method of claim 1, wherein said selectively forming process for the first insulating layer is a plasma assisted nitridation process comprising providing a plasma source gas selected from the group consisting of NH$_3$, N$_2$, NO, N$_2$O, and combinations thereof.

7. The method of claim 4, wherein said silicon nitride layer is formed at a thickness of from about 5 Angstroms to about 50 Angstroms.

8. The method of claim 4, wherein said silicon nitride layer is formed in tensile stress.

9. The method of claim 1, wherein the hardmask layer comprises a material selected from the group consisting of silicon nitride, silicon oxynitride, and combinations thereof.

10. The method of claim 1, wherein the wet etching process comprises a heated phosphoric acid solution.

11. The method of claim 1, further comprising a silicon oxide layer underlying said uppermost nitride hardmask layer.

12. The method of claim 11, further comprising a second wet etching process comprising a hydrofluoric acid (HF) solution to remove the silicon oxide layer.

13. A method for forming a shallow trench isolation (STI) feature substantially free of etching divots at STI trench edges comprising the steps of:
   providing a silicon substrate comprising an overlying pad oxide layer and an uppermost nitride hardmask layer;
   forming an STI trench extending through the uppermost nitride hardmask layer and the overlying pad oxide layer into a thickness of the silicon substrate exposing the silicon substrate to form said STI trench having top and bottom rounded corners comprising said silicon substrate;
   carrying out a nitridation process selected from the group consisting of a thermal nitridation and plasma assisted nitridation to form a silicon nitride layer lining the STI trench limited to exposed silicon substrate portions;
   backfilling the STI trench with a silicon oxide layer;
   planarizing the silicon oxide layer according to a chemical mechanical planarization (CMP) process to stop on the uppermost hardmask layer;
   carrying out a first wet etching process comprising heated H$_3$PO$_4$ to remove the uppermost hardmask layer; and,
   carrying out a second wet etching process comprising hydrofluoric acid (HF) to remove the overlying pad oxide layer.

14. The method of claim 13, wherein the rounded top and bottom corners are formed by a plasma assisted etching process.

15. The method of claim 13, wherein the rounded bottom and top corners are formed according to the steps of:
thermally growing an oxide layer to line the STI trench; and,
removing the oxide layer according to a wet etching process.

16. The method of claim 13, wherein the thermal nitridation process comprises heating in an $NH_3$ containing ambient at a temperature of from about 600° C. to about 900° C.

17. The method of claim 13, wherein the plasma assisted nitridation process comprises providing a plasma source gas selected from the group consisting of $NH_3$, $N_2$, NO, $N_2O$, and combinations thereof.

18. The method of claim 13, wherein the silicon nitride layer is formed at a thickness of from about 5 Angstroms to about 50 Angstroms.

19. The method of claim 13, wherein the silicon nitride layer is formed in tensile stress.

20. The method of claim 13, wherein the nitride hardmask layer comprises a material selected from the group consisting of silicon nitride, silicon oxynitride, and combinations thereof.

21. The method of claim 13, wherein the nitride hardmask layer comprises a lowermost silicon nitride layer and an uppermost silicon oxynitride layer.

* * * * *